United States Patent [19]

Shutoh et al.

[11] 4,027,195

[45] May 31, 1977

[54] VOLTAGE SWITCHING DEVICE COMPRISING A GAS DISCHARGE PANEL

[75] Inventors: Masamichi Shutoh; Tsunekiyo Iwakawa; Akira Yano, all of Tokyo, Japan

[73] Assignee: Nippon Electric Company Ltd., Tokyo, Japan

[22] Filed: Aug. 14, 1975

[21] Appl. No.: 604,883

[30] Foreign Application Priority Data

| Aug. 23, 1974 | Japan | 49-96745 |
| Sept. 6, 1974 | Japan | 49-102821 |
| Sept. 20, 1974 | Japan | 49-108551 |
| Oct. 3, 1974 | Japan | 49-114532 |
| Oct. 3, 1974 | Japan | 49-114533 |

[52] U.S. Cl. .............. 315/169 TV; 101/DIG. 13; 313/217; 340/324 M
[51] Int. Cl.² .................. H05B 41/36; H01J 65/00
[58] Field of Search ............ 315/169 R, 169 TV; 340/324 M, 166 EL, 173 PL; 313/188, 201, 217; 219/216; 307/113, 115; 101/DIG. 13

[56] References Cited

UNITED STATES PATENTS

| 3,798,483 | 3/1974 | Walters | 313/217 X |
| 3,891,983 | 6/1975 | Lee | 340/324 M X |
| 3,893,101 | 7/1975 | Glaser | 315/169 TV X |
| 3,909,665 | 9/1975 | Andoh et al. | 315/169 TV |
| 3,971,465 | 7/1976 | Benn | 101/DIG. 13 |

*Primary Examiner*—Eugene R. La Roche
*Attorney, Agent, or Firm*—Hopgood, Calimafde, Kalil, Blaustein & Lieberman

[57] ABSTRACT

A voltage switching device operable by an electric power source comprises a gas discharge panel that includes opposing first and second electrodes and gas discharge cells therebetween. Resistors are connected between the power source and the respective first electrodes and switching means are connected between the power source and the second electrodes. In consideration of the power source terminal voltage and of the firing voltage of the gas discharge cells, the resistance values of the resistors are determined so as to prevent the gas discharge from spreading over the entire area of each gas discharge cell.

5 Claims, 15 Drawing Figures

VOLTAGE SWITCHING DEVICE COMPRISING A GAS DISCHARGE PANEL

BACKGROUND OF THE INVENTION

This invention relates to a voltage switching device which includes a gas discharge panel of a type similar to that known as a gas discharge or plasma display panel. The gas discharge panel included in a voltage switching device in accordance with this invention is different from a conventional gas discharge display panel in that the former does not necessarily show a display as is the case with a control portion of a gas discharge display panel of the type disclosed in copending U.S. patent application Ser. No. 555,139, now U.S. Pat. No. 3,976,971. A voltage switching device according to the present invention is useful in applying a relatively high voltage to a selected one or ones of a plurality of electrodes, such as in the selection of electrodes of a gas discharge display panel or in the scanning of electrodes of an electrostatic printer.

A gas discharge display panel comprises at least one first electrode and a plurality of second electrodes disposed opposite to the first electrode. A plurality of spaces defined by the first and second electrodes are filled with an ionizable gas to serve as gas discharge spaces or cells. In order to make such a gas discharge display panel provide a desired display, a voltage switching device is necessary to supply a voltage higher than the firing voltage of the cells across those one or ones of the cells which are selected in accordance with the desired display. Under these circumstances, each of the cells corresponds to a picture element of the displays. A conventional voltage switching device for use in selecting the cells of the panel comprises either a plurality of switching transistors or a diode matrix adapted for connection to the respective electrodes of the panel. With an increase in the number of electrodes of the panel, a corresponding increase has been necessary in the number of elements, such as the transistors or diodes, of the voltage switching device. As a result, there have been problems and drawbacks with the conventional voltage switching device with respect to the reliability and cost of the device and the difficulty in connecting the device to the electrodes of the display panel.

A color gas discharge display panel for producing colored displays comprises a set of a predetermined number of gas discharge cells for each picture element of the displays. The cells of each set comprise the predetermined number of layers of luminescent materials of different colors, such as red, green, and blue. A device for making the panel display a desired colored display comprises means for selecting a desired one or ones of the cell sets and means for selecting a combination of cells in each selected cell set. The selection of a desired cell combination has to be carried out for each selected cell set so that each picture element may be displayed in a desired color. In other words, the selection of a picture element has to be accompanied by the selection of the color of the selected picture element. This has complicated the voltage switching device.

An electrostatic printer of an electronically scanned type is preferred to a mechanically scanned multi-stylus electrostatic printer and to an electrostatic printer comprising an electrostatic recording cathode-ray tube. As pointed out in U.S. Pat. No. 3,750,190 an electrostatic printer of the mechanical scanning type is disadvantageous with respect to its short service life and to troubles in its maintenance. An electrostatic recording cathode-ray tube is objectionable as the necessity of a very high voltage for putting the cathode-ray tube into operation and difficulties in adjusting the operation of the tube. A device for switching a voltage that is sufficiently high for electrostatic recording is very desirable for electronically scanning electrodes, such as the styli, of the printer while successively supplying the electrodes with signals that are to be recorded.

SUMMARY OF THE INVENTION

It is therefore an object of the present invention to provide a voltage switching device of a simple structure and which is still operable with high reliability.

It is another object of this invention to provide a voltage switching device of the type described for use in scanning the electrodes of a monochromatic gas discharge display panel.

It is still another object of this invention to provide a voltage switching device of the type described for use in scanning the electrodes of a color gas discharge display panel.

It is yet another object of this invention to provide a voltage switching device of the type described for use in electronically scanning the electrodes of an electrostatic printer.

A voltage switching device according to this invention is operable by an electric power source providing a voltage between its first and second terminals and includes a gas discharge panel comprising a group of first electrodes on one surface of a first substrate and a group of second electrodes on one surface of a second substrate. The first and second substrates have their outer edges hermetically sealed with the first electrodes disposed opposite to the second electrodes across a gap and with an ionizable gas introduced into the gap so that a plurality of gas discharge spaces or cells having a substantially common firing voltage are formed at positions where the first electrodes face the second electrodes. Besides the gas discharge panel, the device comprises a plurality of resistors having first ends connected to the respective first electrode and second ends adapted for connection to the first terminal of the power source. The device further comprises switching means having first ends connected to the respective second electrodes and a second end adapted for connection to the second terminal of the power source. The device is further characterized in that the resistance values of the resistors are determined in consideration of the voltage provided by the power source and of the substantially common firing voltage so as to prevent a gas discharge from spreading over the entire area of each of the gas discharge cells.

When connected to the power source, a voltage switching device according to this invention selectively produces at the first electrodes a high voltage determined by the power source terminal voltage and a low voltage determined by the discharge cell firing voltage in accordance with a preselected logic operation of the switching means.

Figure 1:
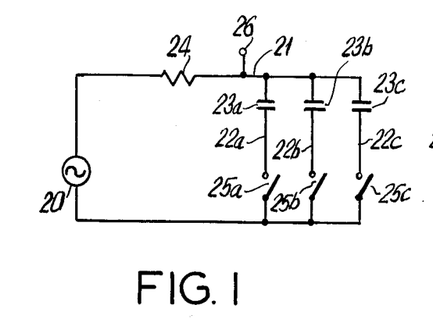
FIG. 1 is an equivalent circuit of a voltage switching device together with an electric power source for use in describing the principles of operation of a voltage switching device according to the instant invention.

DESCRIPTION OF THE PREFERRED EMBODIMENTS:

In FIG. 1, which illustrates the principles of operation of a voltage switching devices according to the present invention, a voltage switching device of a type to which this invention is applicable is operable by an electric power source 20 providing a voltage between its first and second terminal and includes a gas discharge panel. In the equivalent circuit shown in FIG. 1, the gas discharge panel comprises a first electrode 21 and a plurality of second electrodes 22a, 22b, and 22c opposing the first electrode 21 with an equal number of first through third gas discharge cells 23a, 23b, and 23c formed therebetween. In addition to the gas discharge panel, the voltage switching device comprises a stabilizing resistor 24 having a first end connected to the first electrode 21 and a second end adapted for connection to the first terminal of the power source 20. The voltage switching device further comprises first through third switches 25a, 25b, and 25c having first terminals connected to the respective second electrodes 22 (suffixes a, b, and c and the being omitted hereunder where intelligible) and a common second end adapted before connection to the second terminal of the power source 20. For convenience of description, it is assumed that an output terminal 26 is connected to a point of connection of the resistor 24 to the first electrode 21. The gas discharge cells 23 have a substantially common firing voltage. In consideration of the voltage provided by the power source 20 and the firing voltage of the gas discharge cells 23, the resistance of the resistor 24 is determined so as to prevent a gas discharge from spreading over the entire area of each gas discharge cell 23 in the meaning described in the above-referenced patent application in conjunction with the control gas discharge spaces or cells. In practice, the switches 25 are preferably electronic switches, each comprising either a transistor or a diode as the switching element.

In operation, it is assumed that the power source 20 is connected to the voltage switching device as shown in FIG. 1, that the first and second electrodes 21 and 22 are coated with layers of a dielectric material, respectively, and that the power source 20 provides a high frequency voltage that is higher in its peak-to-peak value than the unidirectional firing voltage of the gas discharge cells 23. When the switches 25 are all turned off, a high voltage that is substantially equal to the terminal voltage of the power source 20 is supplied to the output terminal 26. When one of the switches 25, for example, the first switch 25a, is closed, a gas discharge occurs in the corresponding gas discharge cell 23a. As a result of the gas discharge and of the consequent electric current flowing through the resistor 24, a low voltage that is substantially equal to the unidirectional discharge sustaining voltage of the gas discharge cells 23 is applied to the output terminal 26. When two or more switches 25 are turned on, the low voltage also appears at the output terminal 26. In a gas discharge panel which comprises first and second electrodes 21 and 22, all of which are exposed to the respective gas discharge cells 23, use should be made of an electric power source 20 providing a d.c. voltage that is higher than the unidirectional firing voltage. In any event, the expression "operable" used for the power source 20 should be understood to mean that the voltage provided thereby is capable of initiating and sustaining a gas discharge in any one of the gas discharge cells 23 selected by the actuation of a corresponding one of the switches 25.

Figure 2:
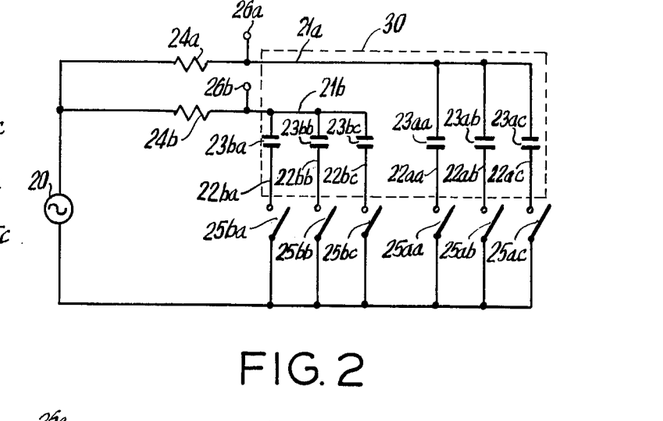
FIG. 2 is an equivalent circuit of a voltage switching device according to a first embodiment of this invention together with an electric power source.
Figure 3A:
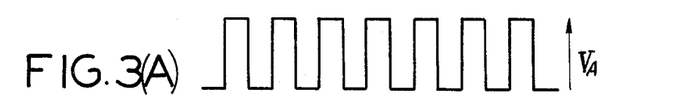
FIG. 3 schematically shows signals appearing at several points in the voltage switching device illustrated in FIG. 2.
Figure 3B:
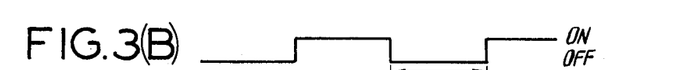
Figures 3C, 3D:
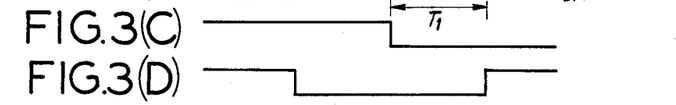
Figures 3E, 3F:
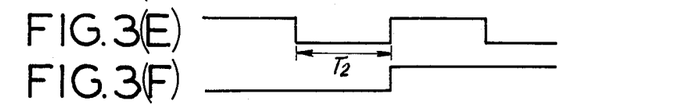
Figures 3G, 3H:
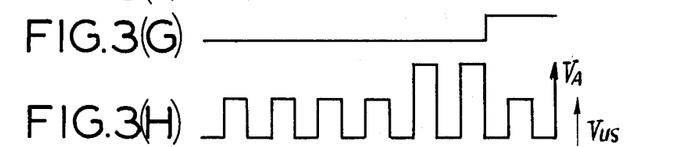
Figure 3I:
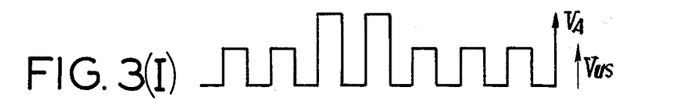
Figure 3J:
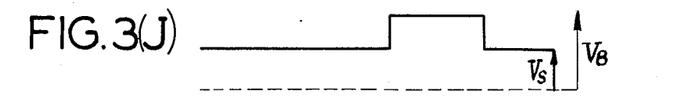
Figure 3K:
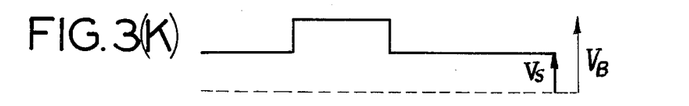

A voltage switching device according to a first embodiment of this invention as illustrated in FIG. 2, is operable by an electric power source 20 having a first and a second terminal and includes a gas discharge panel 30. The gas discharge panel 30 comprises first and second electrodes 21a and 21b of a first group, first through sixth electrodes 22aa, 22ab, 22ac, 22ba, 22bb, and 22bc of a second group, gas discharge cells 23aa, 23ab, and 23ac of a first group between the first electrode 21a of the first group and the first through third electrodes 22aa–22ac of the second group, and gas discharge cells 23ba, 23bb, and 23bc of a second group between the second electrode 21b of the first group and the fourth through sixth electrodes 22ba–22bc of the second group. The device comprises first and second stabilizing resistors 24a and 24b having first ends connected to the respective electrodes 21 of the first group and second ends adapted for connection to the first terminal of the power source 20. The device further comprises first through sixth switches 25aa, 25ab, 25ac, 25ba, 25bb, and 25bc having first ends connected to the respective electrodes 22 of the second group and a common second end adapted for connection to the second terminal of the power source 20. First and second output terminals 26a and 26b are respectively connected to the points of connection of the resistors 24a and 24b and to the electrodes 21a and 21b of the first group. As will be described, the voltage switching device selectively supplies a high and a low voltage to the output terminals 26 in accordance with a preselected logic operation of a set of the first through third switches 25aa–25ac and another set of the fourth through sixth switches 25ba–25bc. The arrangement of the gas discharge cells 23 is determined in accordance with the preselected logic operation. When another logic operation is preselected the fourth gas discharge cell 23ba is preferably formed between the second electrode 21b of the first group and the first electrode 22aa of the second group without the use of the fourth electrode 22ba of the second group and the associated fourth switch 25ba. In other respects, the voltage switching device of FIG. 2 is similar to that illustrated in FIG. 1.

Referring to FIG. 3, it is assumed initially that the gas discharge panel 30 is of an a.c. discharge type having layers of a dielectric material on the electrodes 21 and 22 and that the power source 20 provides a continuous rectangular voltage of a peak-to-peak value $V_A$ as shown at FIG. 3 (A). The first through sixth switches 25 are rendered on and off as indicated by a higher and a lower level at FIG. 3 (B), (C), (D), (E), (F), and (G). The first through third switches 25aa–25ac are all turned off during each first interval $T_1$ wile at least one of these switches is turned on during other intervals. The fourth through sixth switches 25ba–25bc are all turned off during each second interval $T_2$ while at least one thereof is turned on during the remaining intervals. The first and second intervals $T_1$ and $T_2$ are staggered with respect to each other. As depicted at FIG. 3 (H) and (I), the voltages appearing at the first and second output terminals 26 are high and are substantially equal to the terminal voltage $V_A$ of the power source 26 during the first and second intervals $T_1$ and $T_2$, respectively, and low and substantially equal to the unidirectional discharge sustaining voltage Vus of the gas discharge cells 23 during the other intervals. If the gas discharge panel 30 is of a d.c. discharge type having no dielectric layers between the electrodes 21 and 22 and the gas discharge cells 23, the power source 20 should provide a d.c. voltage $V_B$ higher than the firing voltage of the gas discharge cells 23. The high and low voltages selectively applied to the output terminals 26 are substantially equal to the terminal voltage $V_B$ of the power source 20 during the first and second intervals $T_1$ and $T_2$ as illustrated at FIG. 3 (J) and (K), respectively, and substantially equal to the discharge sustaining voltage Vs of the gas discharge cells 23 during the other intervals as shown also at FIG. 3 (J) and (K). In either case, the high and low voltages appear at the output terminals 26 in accordance with the preselected logic operation of the switches 25aa–25ac and 25ba–25bc of the respective sets.

Figure 4:
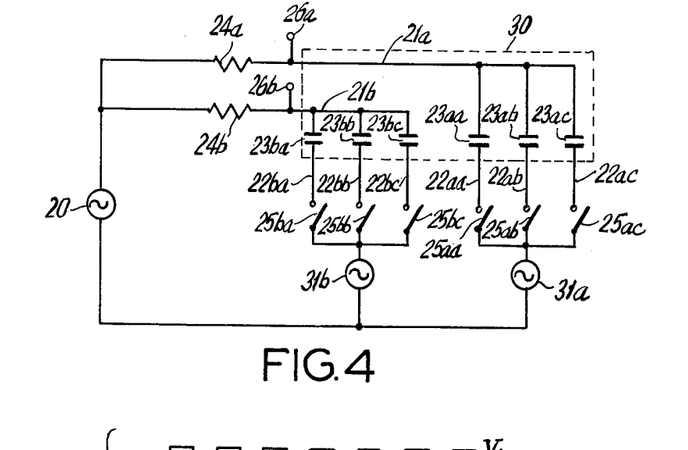
FIG. 4 is an equivalent circuit of a voltage switching device according to a second embodiment of this invention together with an electric power source.

The voltage switching device according to a second embodiment of this invention as illustrated in FIG. 4 is similar to that illustrated in FIG. 2 except for the inclusion of first and second additional or auxiliary voltage sources 31a and 31b which are connected between the second terminal of the main power source 20 and the respective second ends of the switch sets 25aa–25bc.

Figure 5:
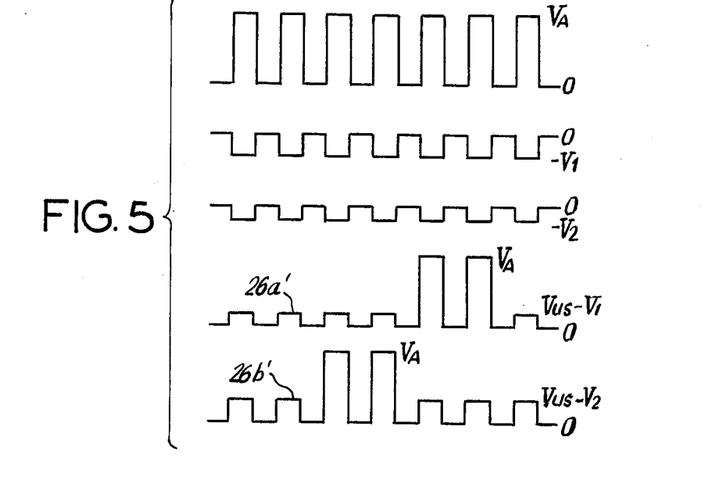
FIG. 5 schematically shows signals appearing at a few points in the voltage switching device depicted in FIG. 4.

Referring to FIG. 5, it is again assumed that the gas discharge panel 30 is of an a.c. discharge type and that the main power source 20 provides a continuous rectangular voltage $V_A$. The first and second additional voltage sources 31 provide continuous rectangular voltages $V_1$ and $V_2$ of polarities opposite to that of the voltage $V_A$ provided by the main power source 20 and of peak-to-peak values lower than the unidirectional discharge sustaining voltage Vus of the gas discharge cells 23. As shown at 26a' and 26b', the high voltages appearing at the respective output terminals 26 with respect to the second terminal of the main power source 20 during the first and second intervals $T_1$ and $T_2$ illustrated in FIG. 3 are substantially equal to the main power source terminal voltage $V_A$. When one of the switches 25 is turned on, the voltage developed across the associated gas discharge cell 23 is maintained at the unidirectional discharge sustaining voltage Vus. The low voltages appearing at the output terminals 26 with respect to the second terminal of the main power source 20 during the remaining intervals are therefore substantially equal to the unidirectional discharge sustaining voltage Vus minus the respective voltages $V_1$ and $V_2$ of the additional voltage sources 31 as depicted at 26a' and 26b'. The main power source 20 and additional voltage sources 31 may provide d.c. voltages. In either event, it is thus possible with the voltage switching device according to the embodiment of FIG. 4 to make the low voltages developed at the output terminals 26 determined by the discharge sustaining voltage Vus or Vs but adjusted by the additional voltages $V_1$ and $V_2$. When it is desired to make the low voltages shown at 26a' and 26b' equal to each other, use may be made of a single additional voltage source instead of the two voltage sources 31 shown in FIG. 4.

Figure 6:
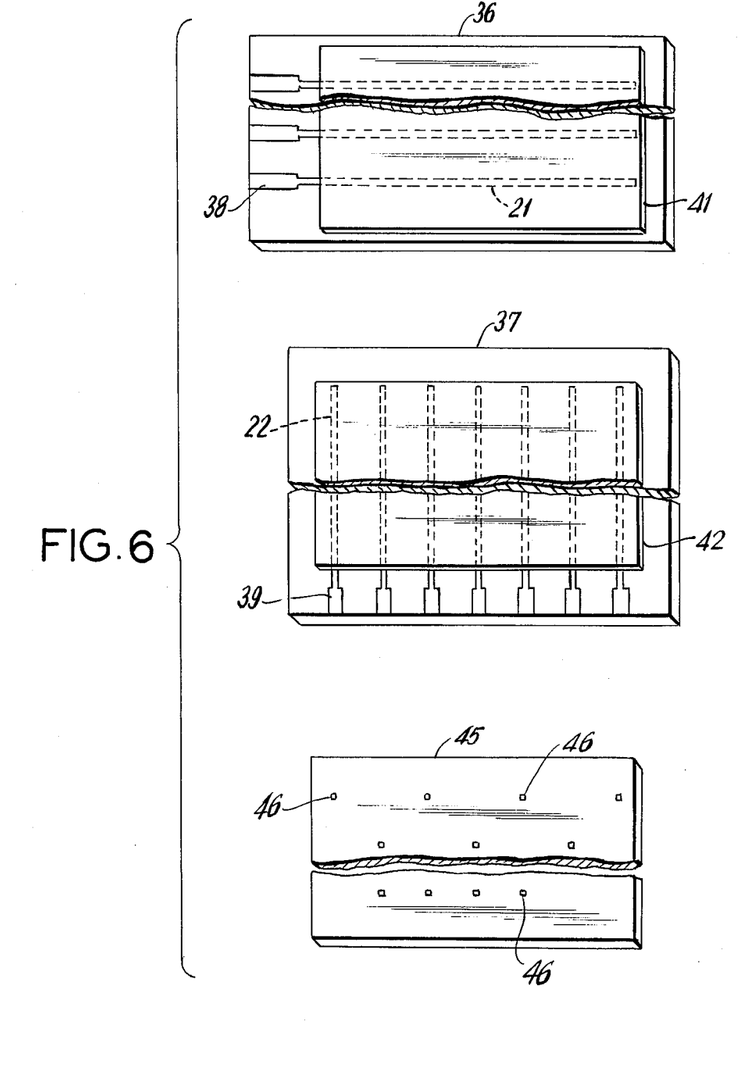
FIG. 6 is a schematic exploded view of a gas discharge panel which may be used in a voltage switching device according to this invention.

FIG. 6 illustrates, a gas discharge panel of a matrix electrode type and of an a.c. discharge type that may be used in the voltage switching device according to the first or second embodiment. As described, the panel comprises first and second electrodes 21 and 22 on first and second rectangular glass substrates 36 and 37 parallel to the long and short edges of the respective substrates 36 and 37. The first and second electrodes 21 and 22 reach terminals 38 and 39 arranged along one or both of the remaining edges of the substrates 36 and 37. The first and second substrates 36 and 37 are covered with layers 41 and 42 of a dielectric material except at the areas for the terminals 38 and 39. It will be seen that the first electrodes 21 intersect the second electrodes 22 when the substrates 36 and 37 are superposed on each other with the dielectric layers 41 and 42 brought into face-to-face relation across a gap. In order to provide the gap and a predetermined arrangement of the gas discharge cells, use may be made of a center sheet 45 having a plurality of holes 46 formed therethrough at the positions of the gas discharge cells. Outer edges of the substrates 36 and 37 are hermetically sealed with the terminals 38 and 39 extending outwardly of the sealed edges and an ionizable gas is introduced into the gap to provide the gas discharge cells. It is readily possible to achieve a substantially common firing voltage for the gas discharge cells, as by rendering the gap substantially constant throughout the cells and the areas of the cells substantially equal to one another. For a gas discharge panel of a d.c. discharge type, no dielectric layers are formed on the electrodes 21 and 22. The electrodes 21 and 22 with or without the dielectric layers 38 and 39 are designated electrode means in the appended claims. Although not shown in FIG. 6, the resistors 24 may be formed on the first substrate 36 between the electrodes 21 and the respective terminals 38.

Figure 7:
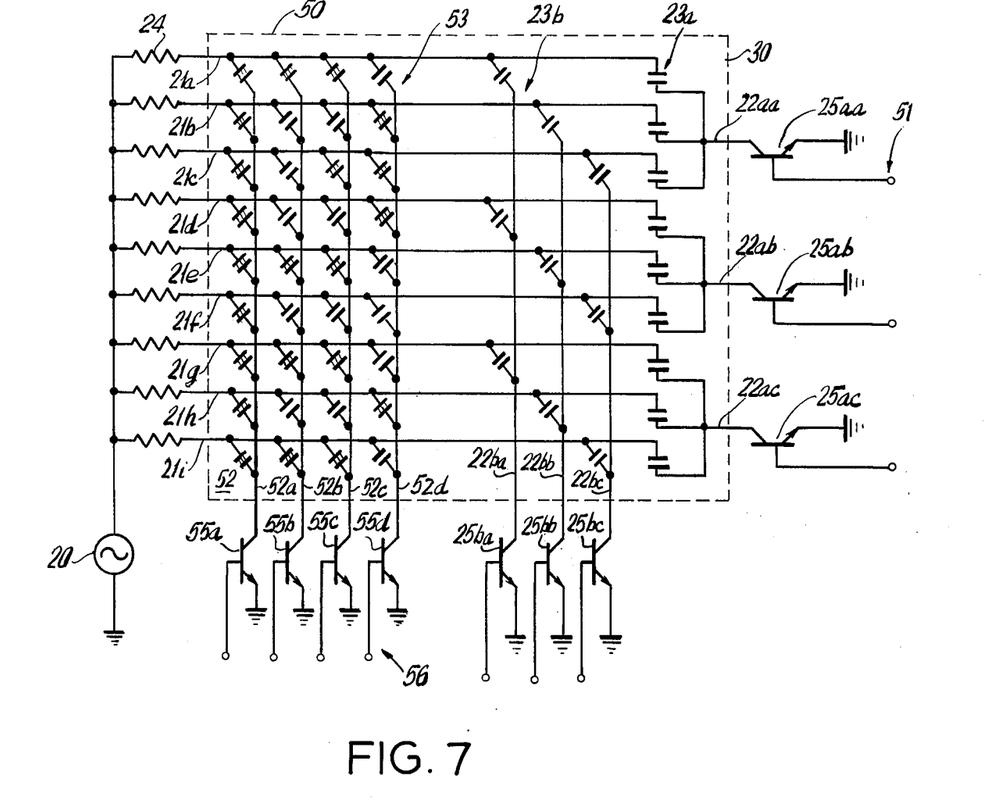
FIG. 7 schematically shows a voltage switching device according to a third embodiment of this invention together with an electric power source and a gas discharge display panel.
Figure 8A:
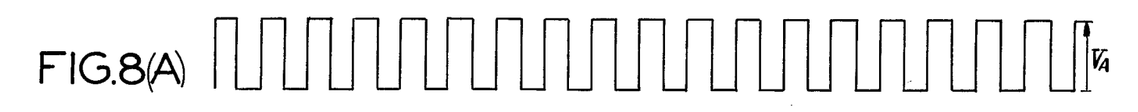
FIG. 8 schematically shows signals appearing at several points in the voltage switching device illustrated in FIG. 7.
Figure 8B:
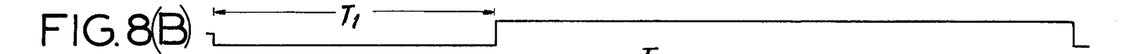
Figure 8C:
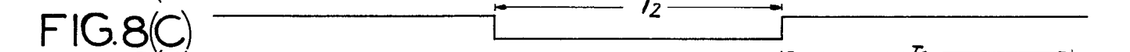
Figure 8D:
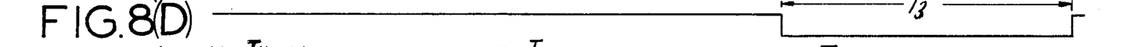
Figure 8E:
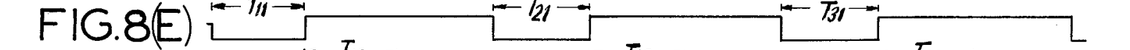
Figure 8F:
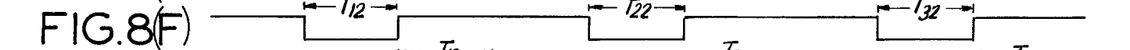
Figure 8G:
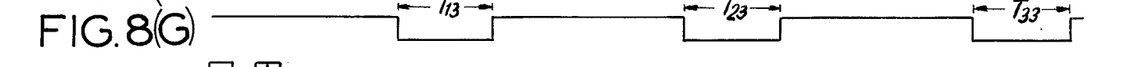
Figure 8H:
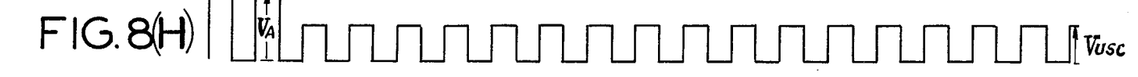
Figure 8I:
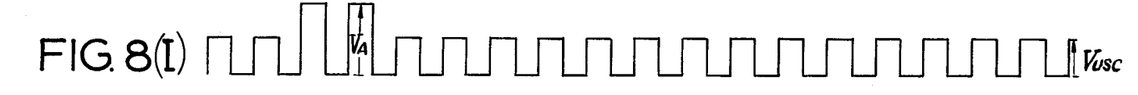

The voltage switching device according to a third embodiment of this invention as shown in FIG. 7 is operable by an electric power source 20 having one of its terminals grounded and includes a control gas discharge panel 30 that is made integral with a gas discharge display panel 50. In the example being illustrated, the control and display panels 30 and 50 are of an a.c. discharge type. For simplicity of illustration, the control panel 30 comprises only first through ninth electrodes 21a, 21b, 21c, 21d, 21e, 21f, 21g, 21h, and 21i of a first group and first through sixth electrodes 22aa, 22ab, 22ac, 22ba, 22bb, and 22bc of a second group. Nine control gas discharge cells 23a of a first group are formed between three successive electrodes 21a–21c, 21d–21f, or 21g–21i of the first group and each of the first through third electrodes 22aa–22ac of the second group. Nine control gas discharge cells 23b of a second group are formed between every three electrodes 21a, 21d and 21g, 21b, 21e and 21h, or 21c, 21f and 21i of the first group and each of the fourth through sixth electrodes 22ba–22bc of the second group so that two first-group and second-group control cells 23a and 23b may be disposed along each electrode 21 of the first group. The voltage switching device comprises nine stabilizing resistors 24 having first ends connected to the respective electrodes 21 of the first group and second ends adapted to connection to an ungrounded terminal of the power source 20. The device further comprises first through sixth NPN transistors 25aa, 25ab, 25ac, 25ba, 25bb, and 25bc of a first set having their collector electrodes connected to the first through sixth electrodes 22aa–22bc of the second group, respectively, emitter electrodes grounded, and base electrodes connected to first control terminals 51 so as to serve as the switches 25 illustrated in FIGS. 1, 2, and 4.

Further referring to FIG. 7, the integral gas discharge display panel 50 comprises the electrodes 21 of the control-panel first group as electrodes of a first group of the display panel 50, first through fourth electrodes 52a, 52b, 52c, and 52d of a third group, namely, of a second group of the display panel 50, transversely of the electrodes 21 of the first group, and display gas discharge cells 53 at positions where the electrodes 21 of the first group intersect the electrodes 52 of the display-panel second group. It should be noted here that the high and low voltages appearing at the output terminals 26 are the voltages which appear at the electrodes 21 of the first group. The display panel 50 is accompanied by first through fourth NPN transistors 55a, 55b, 55c, and 55d of a second set having collector electrodes connected to the first through fourth electrodes 52a–52d of the display-panel second group, respectively, emitter electrodes grounded, and base electrodes connected to second control terminals 56. As described in the above-referenced patent application, the unidirectional firing voltage Vufc of the control cells 23 is made lower than the unidirectional discharge sustaining voltage Vusd of the display cells 53. Four display cells 53 disposed along each electrode 21 of the first group are capable of being lit only when no gas discharge is present in both control cells 23 associated with the said each electrode 21, namely, only when both transistors 25 of the first set coupled to the said both control cells 23 through two relevant electrodes 22 of the control-panel second group are rendered nonconductive. One or more of the said four display cells 53 are actually lit when the second-set transistor or transistors 55 associated with the said one or more display cells 53 are rendered conductive.

Referring also to FIG. 8, the power source 20 provides a continuous rectangular voltage $V_A$ as shown at FIG. 8 (A). The first through third transistors 25aa–25ac of the first set are cyclically rendered nonconductive during first through third major intervals $T_1$, $T_2$, and $T_3$ as illustrated at FIG. 8 (B), (C), and (D), respectively. The fourth through sixth transistors 25ba–25bc of the first set are cyclically rendered nonconductive during first through ninth minor intervals $T_{11}$, $T_{12}$, $T_{13}$, $T_{21}$, $T_{22}$, $T_{23}$, $T_{31}$, $T_{32}$, and $T_{33}$ as shown at FIG. 8 (E), (F), and (G). The first through third, the fourth through sixth, and the seventh through ninth minor intervals $T_{11}$–$T_{13}$, $T_{21}$–$T_{23}$, and $T_{31}$–$T_{33}$ occur in the first through third major intervals $T_1$–$T_3$, respectively. As depicted at FIG. 8 (H), (I), and (J), the voltages appearing at the first through third electrodes 21a–21c of the first group therefore become high and substantially equal to the rectangular voltage $V_A$ during the first through third minor intervals $T_{11}$–$T_{13}$, respectively, when the fourth through sixth transistors 25ba–25bc of the first set are rendered nonconductive while the first transistor 25aa of the first set is also nonconductive. During these intervals $T_{11}$–$T_{13}$, the display cells 53 aligned along the first through third electrodes 21a–21c are therefore capable of being lit. The voltages appearing at the first through third electrodes 21a–21c of the first group become low and substantially equal to the unidirectional discharge sustaining voltage Vusc of the control cells 23 during other intervals, when the display cells 53 arranged along the first through third electrodes 21a–21c of the first group can never be lit. The display cells 53 disposed along the remaining electrodes 21d–21i of the first group are similarly conditioned. If the transistors 55a–55d of the second set are rendered conductive in a manner exemplified at FIG. 8 (K), (L), (M), and (N) to respectively ground the electrodes 52 of the display-panel second group synchronously with the minor intervals $T_{11}$–$T_{33}$, the high voltage derived by the voltage switching device are cyclically applied across those hatched display cells 53 which are disposed along the respective electrodes 21 of the first group.

Again referring to FIGS. 7 and 8, it will be appreciated in conjunction with the example described hereinabove that a set of three electrodes 21a–21c, 21d–21f, or 21g–21i of the first group are selected by rendering one of the first through third transistors 25aa–25ac of the first set nonconductive and that one electrode 21 in each electrode set is selectively by rendering a corresponding one of the fourth through sixth transistors 25ba–25bc of the first group nonconductive to allow the display cells 53 arranged along the selected one electrode 21 to be lit. The voltage switching device carries out such selection with only six transistors 25 rather than nine, the number of the electrodes 21 subjected to selection. It is feasible to use a plurality of electric power sources instead of the single power source 20 to divide the electrodes 21 of the first group into a like number of subgroups as will be described hereunder.

Figure 9:
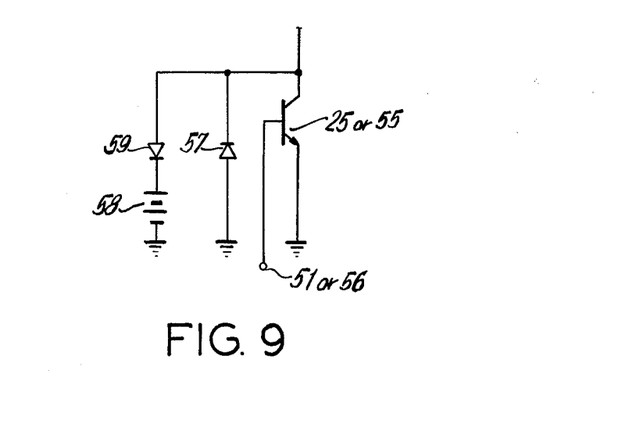
FIG. 9 is a schematic circuit diagram of switching means which may be alternatively used in the voltage switching device according to this invention.

Referring to FIG. 9, each of the transistors 25 and 55 illustrated in the embodiment of FIG. 7 may accompany a first diode 57 having its anode grounded and cathode connected to the collector electrode of the transistor 25 or 55, a clamping voltage source 58 of a terminal voltage V having its negative terminal grounded, and a second diode 59 having its anode connected to the above-mentioned collector electrode and cathode connected to the positive terminal of the clamping voltage source 58. This circuit arrangement clamps the collector electrode to the clamping voltage V of the clamping voltage source 58 during the nonconductive intervals of the transistor 25 or 55 and protects the transistor 25 or 55 against an unduly high voltage which would otherwise be induced across the transistor 25 or 55 during the nonconductive intervals by the rectangular voltage $V_A$ through the control or display cells 23 or 53 coupled to the transistor 25 or 55.

Figure 10:
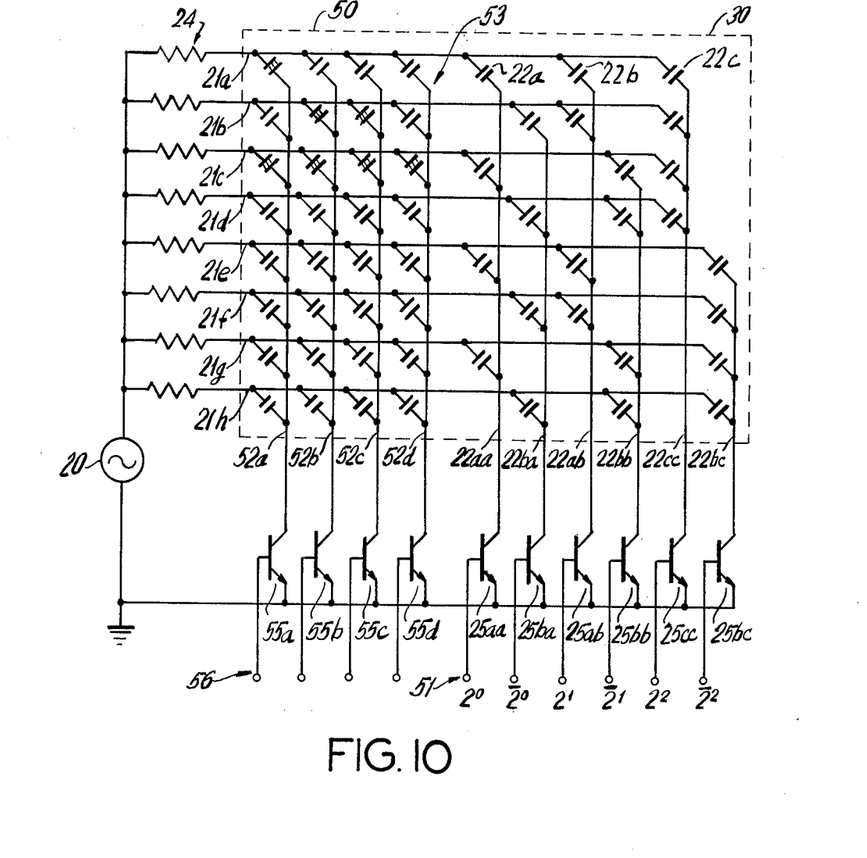
FIG. 10 schematically shows a voltage switching device according to a fourth embodiment of this invention together with an electric power source and a gas discharge display panel.

The voltage switching device according to a forth embodiment of this invention, as shown in FIG. 10 wherein eight electrodes 21 of the first group are shown for brevity of description, is different from that illustrated in FIG. 7 in that three control gas discharge cells, such as cells 23a, 23b, and 23c, are formed along each electrode 21 of the first group so as to enable independent selection of these electrodes 21. More particularly, control voltages representative of binary codes $2^0$, $2^1$, and $2^2$ are applied to first control terminals 51 connected to the base electrodes of the first through third transistors 25aa–25ac of the first group, respectively, while control voltages representative of reversed binary codes $2^{-0}$, $2^{-1}$, and $2^{-2}$ are supplied to the first control terminals 51 connected to the base electrodes of the fourth through sixth transistors 25ba–25bc of the first group, respectively. As a result, the first through third transistors 25aa–25ac are conductive when the fourth through sixth transistors 25ba–25bc are conductive, respectively, and vice versa.

Figure 11:
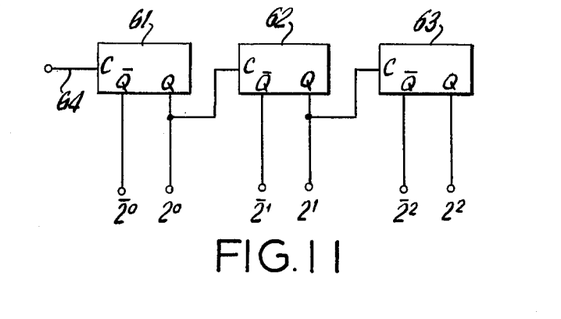
FIG. 11 is a block diagram of a binary counter which may be used to control the switching means included in the voltage switching device depicted in FIG. 10.

The three-bit binary counter shown in FIG. 11 comprises first through third flip-flop circuits 61, 62, and 63 connected in a known manner, as shown. When clock pulses on an input line 64 are supplied to clock input terminal C of the first or least significant digit flip-flop circuit 61, signals representative of binary codes $2^0$ and $2^{-0}$, $2^1$ and $2^{-1}$, and $2^2$ and $2^{-2}$ are produced from the Q and $\bar{Q}$ output terminals of the first through third flip-flop circuits 61–63. These signals may be supplied to the first control terminals 51 depicted in the voltage switching device of FIG. 10 through impedance elements (not shown in FIGS. 10 and 11).

Referring again to FIG. 10, it will be understood that the electrodes 21 of the first group are repeatedly selected one at a time when a gas discharge is present in none of the three control gas discharge cells, such as cells 23a–23c, associated with each electrode 21 and when a gas discharge is present in at least one of the three control cells 23 associated with each of the remaining electrodes 21. If the control cells 23 are arranged as shown the, selection of the electrodes 21 is carried out in accordance with the following TABLE given for the binary codes. The transistors 25aa–25bc of the

TABLE

| $2^0$ | $2^1$ | $2^2$ | $\overline{2}^0$ | $\overline{2}^1$ | $\overline{2}^2$ | Selected electrode |
|---|---|---|---|---|---|---|
| low | low | low | high | high | high | 21a |
| high | low | low | low | high | high | 21b |
| low | high | low | high | low | high | 21c |
| high | high | low | low | low | high | 21d |
| low | low | high | high | high | low | 21e |
| high | low | high | low | high | low | 21f |
| low | high | high | high | low | low | 21g |
| high | high | high | low | low | low | 21h | first group are rendered off and on according as "low" and "high" signals are supplied thereto. It is thus possible to make the gas discharge display panel 50 show a desired display exemplified by hatches by rendering the first transistor 55a of the second group conductive while control signals for the binary codes $2^0$–$2^2$ are all low, the second and third transistors 55b and 55c conductive while the control signals are high, low, and low, and the transistors 55a–55d conductive while the control signals are low, high, and low.

Figure 12:
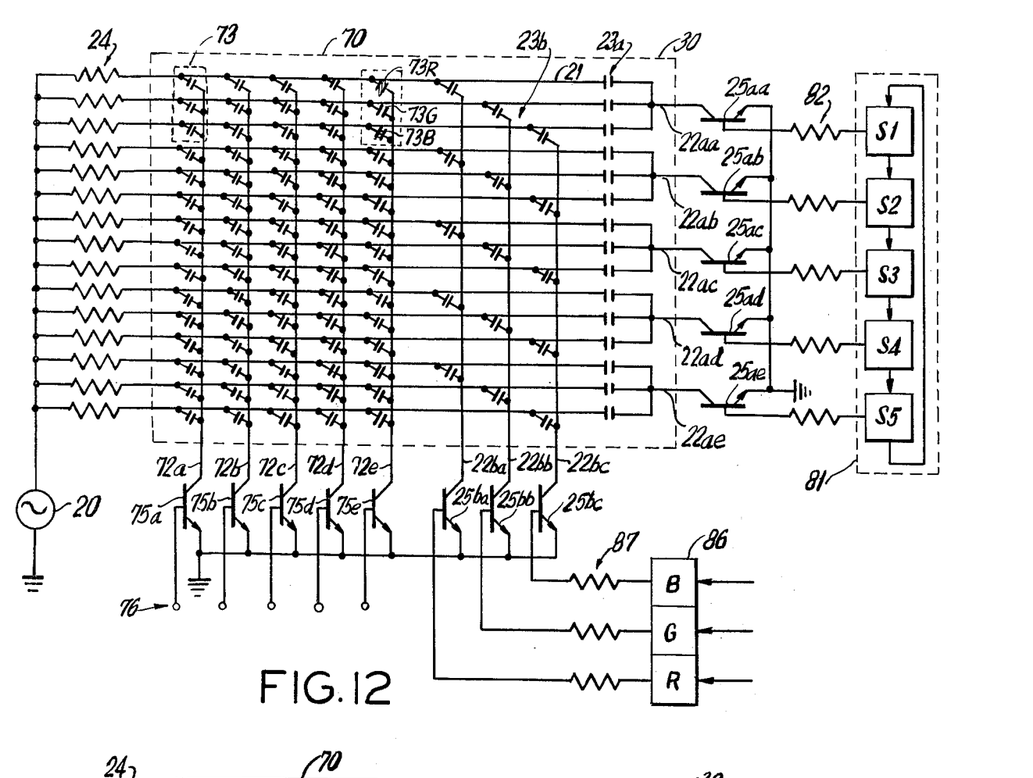
FIG. 12 schematically shows a voltage switching device according to a fifth embodiment of this invention together with an electric power source, a color gas discharge display panel, and control circuits for the switching means included in the voltage switching device.

FIG. 12 illustrates a voltage switching device according to a fifth embodiment of this invention for scanning electrodes 21 of a first group of a color gas discharge display panel 70 that is made integral with a control gas discharge panel 30 with the electrodes 21 shared in common by both panels 30 and 70. In the device illustrated as an example of this embodiment first through fifteenth electrodes 21 of the first group are shown. First through fifth electrodes 22aa–22ae of a control-panel second group are coupled to the first through third and the like electrodes 21 of the first group through control gas discharge cells 23a of a first group. Sixth through eighth electrodes 22ba–22bc, three in number corresponding to the three primary colors, of the control-panel second group are coupled to every three electrodes 21 of the first group through control gas through cells 23b of a second group so that two control cells, one each from the first and second groups, are coupled to each electrode 21 of the first group. First through eighth transistors 25aa–25ae and 25ba–25bc of a first set are connected to the respective electrodes 22 of the second group. The display panel 70 comprises first through fifth electrodes 72 of a third group, namely, of a display-panel second group, transversely of the electrodes 21 of the first group. A set of three display gas discharge cells 73 is formed between each electrode 72 of the third group and each set of three successive electrodes 21, such as the first through third, the fourth through sixth, or the like electrodes 21, of the first group. Each display cell set 73 corresponds to a picture element of colored displays and consists as illustrated specifically for one typical display cell set, of a red cell 73R, a green cell 73G, and a blue cell 73B depicted with vertical hatches, without hatches, and with horizontal hatches, respectively. First through fifth transistors 75a–75e of a second set are connected to control terminals 76 and to the respective electrodes 72 of the third group. It will be understood that the first through fifth electrodes 22aa–22ae and the sixth through eighth electrodes 22ba–22bc of the control-panel second group select picture elements and colors, respectively.

In the embodiment of FIG. 12, the voltage switching device is accompanied by a ring counter 81 comprising first through fifth stages S1–S5 which are connected to the base electrodes of the first through fifth transistors 22aa–22ae of the first set, respectively, through impedance elements 82. The ring counter 81 cyclically produces a low signal at one of the five stages S1–S5 at a time to render the corresponding one of the transistors 22aa–22ae nonconductive while producing high signals from the remaining stages to render the associated transistors conductive. The device is further accompanied by a register 86 having first through third stages R, G, and B for temporarily storing a red, a green, and a blue color-specifying signal and supplying such signals to the sixth through eighth transistors 22ba–22bc of the first set, respectively, through impedance elements 87. When, for example, the red cells 73R are to be specified, the first stage R supplies a low signal to the sixth transistor 22ba to render the same nonconductive.

Figure 13:
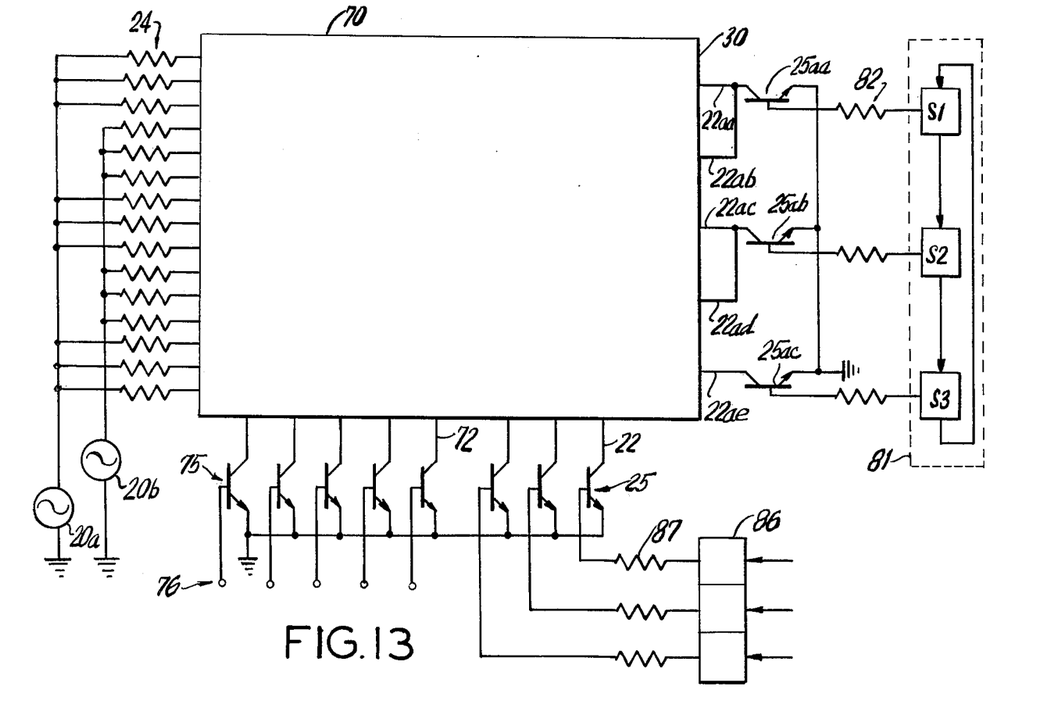
FIG. 13 schematically shows a voltage switching device according to a sixth embodiment of this invention together with a pair of electric power sources, a color gas discharge display panel, and control circuits for the switching means included in the voltage switching device.

The voltage switching device according to a sixth embodiment of this invention, as illustrated in FIG. 13, is similar to that illustrated in FIG. 12 but for its capability of carrying out the interlaced scanning. As has already been mentioned in conjunction with the third embodiment of FIG. 7 use is made of first and second electric power sources 20a and 20b to divide the electrodes 21 of the first group into a first subgroup consisting of the first through third, the seventh through ninth, and the thirteenth through fifteenth electrodes 21 for odd-numbered rows of picture element, and a second subgroup consisting of the fourth though sixth and the ninth through twelfth electrodes 21 for even-numbered rows of picture elements. The power sources 20a and 20b are alternatingly turned on by switching means (not shown) during intervals for scanning the odd-numbered and even-numbered fields, respectively. The first and second electrodes 22aa and 22ab and the third and fourth electrodes 22ac and 22ad of the control-panel second group are connected to first and second transistors 25aa and 25ab of the first set, respectively. Inasmuch as there are only three transistors 22aa–25ac for the selection of the picture elements, the ring counter 81 comprises three stages S1–S3. Additional control cells may be used instead of the additional electric power source or sources and the switching means therefore, and the interlaced scanning may also be resorted to for monochromatic gas discharge displays.

Figure 14:
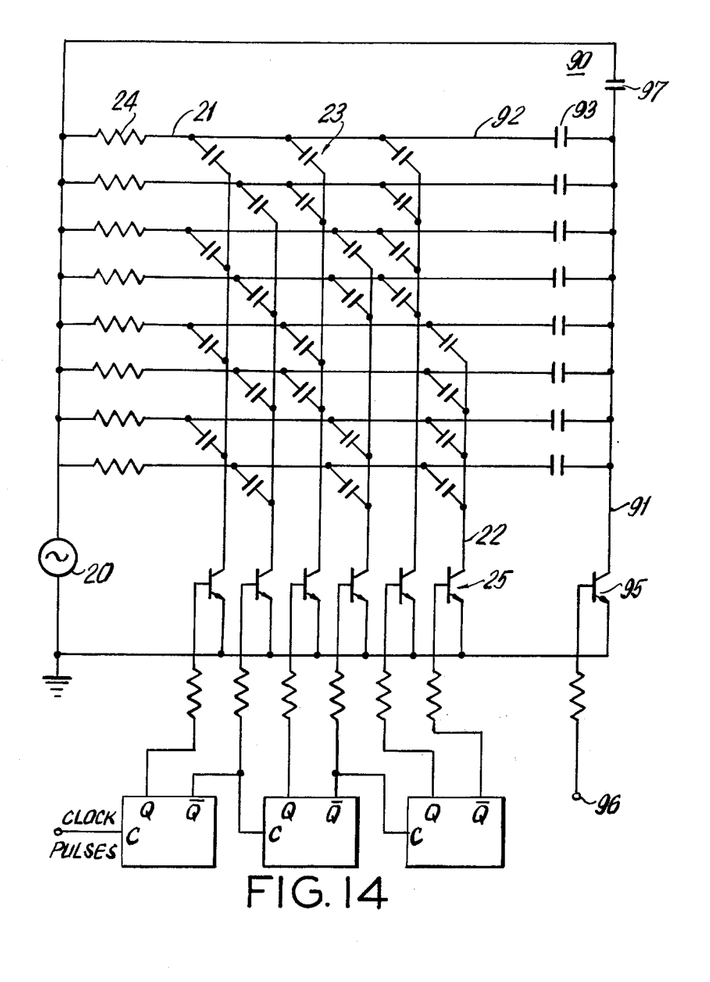
FIG. 14 schematically shows a voltage switching device according to a seventh embodiment of this invention together with two electric power sources, an electrostatic printer, and control circuits for the switching means used in the voltage switching device.

FIG. 14 illustrates a voltage switching device according to a seventh embodiment of this invention which is for an electrostatic printer 90 comprising at least one first electrode 91, a plurality of second electrodes 92 which may be styli, and a like number of printing gaps 93 in which an electrostatic recording medium (not shown) may be placed. The voltage switching device is similar to that illustrated in FIG. 10 and repeatedly scans the second electrodes 92 of the printer 90 to which the electrodes 21 of the first group are connected, respectively. It is assumed that the high voltages produced on the first electrodes 21 are sufficiently high to provide at the printing gaps 93 records on the recording medium when the first electrode 91 is supplied with the electric potential of the second terminal of the power source 20 and that the minimum printing voltage Vmp is higher than the unidirectional firing voltage Vufc of the control gas discharge cells 23. A transistor 95 is connected between ground and the first electrode 91 of the printer 90 and turned on and off by data signals supplied to a control terminal 96 synchronously with the scan of the second electrodes 92. A capacitor 97 may be interposed between the first terminal of the power source 20 and the first electrode 91 to sufficiently induce the terminal voltage of the power source 20 on the first electrode 91 while the transistor 95 is nonconductive. It is possible with this interposition of the capacitor 97 to ensure switching between the high and low voltages of the voltage applied across the printing gaps 93.

Figure 15:
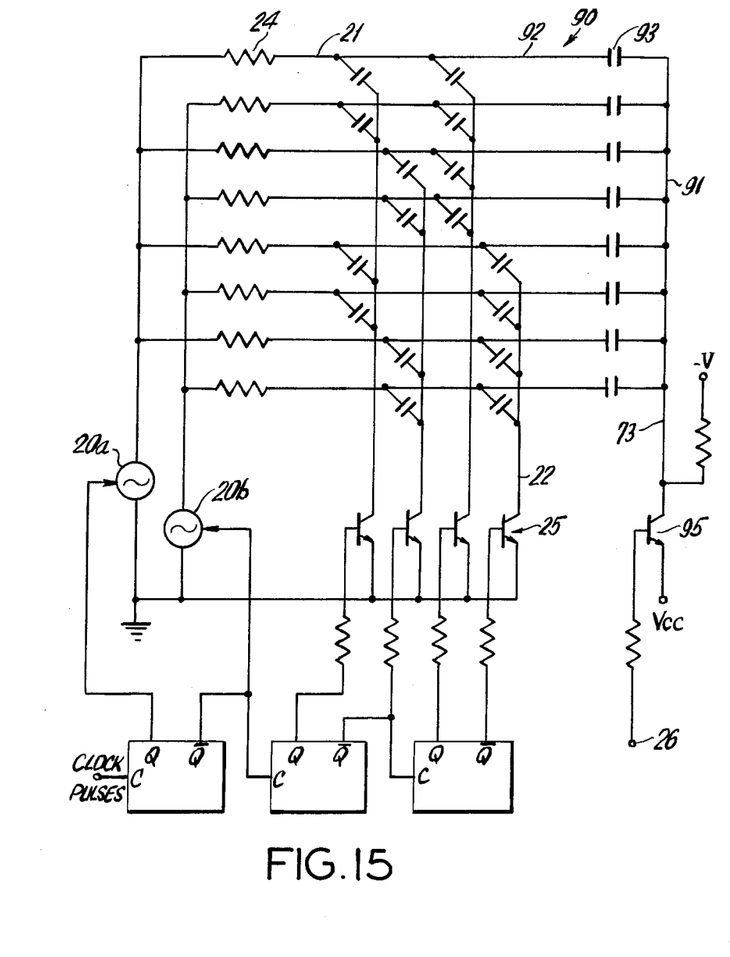
FIG. 15 schematically shows a voltage switching device according to an eighth embodiment of this invention together with an electric power source, an electrostatic printer, and control circuits for the switching means employed in the voltage switching device.

The voltage switching device according to an eighth embodiment of this invention as illustrated in FIG. 15, is similar to that illustrated in FIG. 14. In the embodiment of FIG. 15, a pair of electric power sources 20a and 20b is used in place of the control gas discharge cells 23 for selecting the electrodes 21 of the first group in accordance with obverse and reverse binary codes of the least significant digit, the flip-flop circuit for such binary codes is used as the switching means for the power sources 20a and 20b. The circuit arrangement accompanying the transistor 95 for the first electrode 91 of the printer 90 and comprising voltage sources −V and Vcc raises the voltage applied across the printing gaps 93 higher than the terminal voltage of the power sources 20a and 20b by supplying the first electrode 91 with a bias voltage which is lower than the threshold voltage of providing records on the recording medium.

While several embodiments of this invention and a few modifications thereof have thus far been described, it will be apparent that those skilled in the art may utilize this invention in various other ways. For example, it is feasible to substitute a gas discharge panel of a d.c. discharge type for that of an a.c. discharge type and a gas discharge panel of a segment electrode type for that of a matrix electrode type even where specific mention has not been made hereinabove to those facts. Moreover, an electrostatic printer may be operated by a d.c. power source by the use of a control gas discharge panel of a d.c. discharge type. A capacitor illustrated in the embodiment of FIG. 14 may be resorted to on scanning the electrodes 21 of the first group of a gas discharge display panel 50 or 70.

In addition, it will be understood that a device according to this invention switches the voltage supplied either to the electrodes 21 of first group of a gas discharge display panel 50 or 70 or to the scanning electrodes 92 of an electrostatic printer.

What is claimed is:

1. A voltage switch device operable by a main electric power souce and providing a voltage between a first and second terminal, which comprises:
  a first substrate;
  a second substrate;
  a group of first electrode means on one surface of said first substrate;
  a group of second electrode means on one surface of said second substrate, said first and second substrates having their outer edges hermetically sealed with said first electrode means disposed opposite to said second electrode means across a gap for having an ionizable gas introduced therein so that a plurality of control gas discharge cells having a substantially common firing voltage are formed at predetermined positions where said first electrode means face said econd electrode means;
  a plurality of resistors having first ends respectively connected to said first electrode means and second ends adapted for connection to said first terminal; and
  a plurality of switching means having first ends respectively connected to said second electrode means and second ends adapted for connection to said second terminal, said plurality of control discharge cells being divided into a plurality of groups, each of said plurality of groups including a plurality of subgroups, said second electrode means constituting said discharge cells included in said subgroups being connected to said first ends of mutually different ones of said switching means, said control discharge cells formed of one of said fist electrode means belonging to mutually different ones of said groups.

2. The voltage switching device as claimed in claim 1, further comprising:

extensions of said first electrode means extending outwardly of said gap;

a third electrode outwardly of said gap, said third electrode forming a plurality of printing gaps with predetermined ones of said extensions, said printing gap being adapted to receive an electrostatic recording medium; and an additonal switching element having a first end connected to said third electrode and a second end adapted for connection to said second terminal of said electric power source, said additional switching element being operable in cooperation with said switching means to apply a printing voltage across said recording medium, said printing voltage being higher than the firing voltage of said control gas discharge cells.

3. The voltage switching device as claimed in claim 1, further comprising:

a group of third electrode means on said one surface of said second substrate to face said first electrode means across said gap so that a plurality of display gas discharge cells having a substantially common discharge sustaining voltage are formed at positions where said first electrode means face said third electrode means, the firing voltage of said control gas discharge cells being lower than the discharge sustaining voltage of said display gas discharge cells; and additional switching means having first ends respectively connected to said third electrode means and second ends adapted for connection to said second terminal.

4. The voltage switching device as claimed in claim 3, in which said main electric power source comprises a plurality of electric power sources each having a first and a second terminal, said group of said first electrode means being divided into a plurality of subgroups, each of said subgroups including predetermined ones of said first electrode means, none of said first electrode means belonging to more than one of said subgroups, said first ends of said plurality of resistors being respectively connected to said subgroups of said first electrode means, said second ends of said resistors being adapted for connection to different ones of said first terminals of said electric power sources, said second ends of said switching means being adapted for connection to said second terminals of said electric power sources.

5. The voltage switching device as claimed in claim 3, wherein:

said group of said first electrode means is divided into a plurality of subgroups, each of said subgroups including a first predetermined number of successive ones of said first electrode means, none of said first electrode means belonging to more than one of said subgroups;

said group of said second electrode means being divided into a first and a second set, said first set consisting of said first predetermined number of said second electrode means so that said second electrode means of said first set are in one-to-one correspondence with said first electrode means of each of said subgroups, said second set consisting of the remaining ones of said second electrode means, each of said second electrode means of said second set corresponding to a second predetermined number of said subgroups, said second predetermined number being selected from one and two for each of said second electrode means of said second set so that said second electrode means of said second set are assigned to said first electrode means of said subgroups without duplication;

said control gas discharge cells being formed at first positions where said second electrode means of said first set face the corresponding first electrode means of each of said subgroups, respectively, and at second positions where each of said second electrode menas of said second set faces the first electrode means of the predetermined number of the subgroups assigned thereto;

said display gas discharge cells being formed at positions where each of said third electrode means faces said first electrode means of said subgroups.

* * * * *